(12) United States Patent
Xu (10) Patent No.: US 10,643,111 B2
(45) Date of Patent: May 5, 2020

(54) METHOD, SYSTEM, AND COMPUTER PROGRAM PRODUCT FOR IDENTIFYING DEVICE

(71) Applicant: Siemens Aktiengesellschaft, Munich (DE)

(72) Inventor: Wei Feng Xu, Shanghai (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/555,028

(22) Filed: Aug. 29, 2019

(65) Prior Publication Data

US 2020/0104649 A1 Apr. 2, 2020

Related U.S. Application Data

(63) Continuation of application No. PCT/CN2018/108066, filed on Sep. 27, 2018.

(51) Int. Cl.
*G06K 9/62* (2006.01)
*G06K 9/46* (2006.01)
(Continued)

(52) U.S. Cl.
CPC ......... *G06K 9/6288* (2013.01); *G06F 3/0482* (2013.01); *G06F 3/14* (2013.01);
(Continued)

(58) Field of Classification Search
CPC .... G06K 9/6288; G06K 9/00442; G06K 9/46; G06K 9/6201; G06F 16/93; G06F 3/0482; G06F 3/14; G06F 17/50
See application file for complete search history.

(56) References Cited

U.S. PATENT DOCUMENTS

2016/0171144 A1 6/2016 Suiter
2016/0371397 A1* 12/2016 Deodhar ................. G06F 17/50

FOREIGN PATENT DOCUMENTS

CN 103093011 A 5/2013
CN 104462656 A 3/2015
(Continued)

OTHER PUBLICATIONS

Written Opinion and English translation thereof dated Apr. 28, 2019.
(Continued)

*Primary Examiner* — Roland J Casillas
(74) *Attorney, Agent, or Firm* — Harness, Dickey & Pierce, P.L.C.

(57) ABSTRACT

A method, apparatus, system, storage medium, processor, and terminal for identifying a device are disclosed. The method for identifying a device includes: acquiring image data or video data that includes a device to be identified; acquiring, based on the image data or video data, characteristic information about the device to be identified; acquiring CAD model data about a plurality of device types; acquiring, based on the characteristic information and CAD model data, type information about a target type that identifies the device to be identified; acquiring a device layout document, the device layout document indicating a layout relationship among a plurality of devices that are of a plurality of device types; and acquiring, based on the target type and the layout relationship, target device information about the device to be identified. As such, field devices are identified efficiently by pattern recognition technology, device model, and layout design document data.

12 Claims, 5 Drawing Sheets

(51) Int. Cl.
*G06F 3/0482* (2013.01)
*G06F 17/50* (2006.01)
*G06K 9/00* (2006.01)
*G06F 16/93* (2019.01)
*G06F 3/14* (2006.01)

(52) U.S. Cl.
CPC .............. *G06F 16/93* (2019.01); *G06F 17/50* (2013.01); *G06K 9/00442* (2013.01); *G06K 9/46* (2013.01); *G06K 9/6201* (2013.01)

(56) References Cited

FOREIGN PATENT DOCUMENTS

| | | |
|---|---|---|
| CN | 105718663 A | 6/2016 |
| CN | 107667365 A | 2/2018 |

OTHER PUBLICATIONS

International Search Report PCT/ISA/210 for International Application No. PCT/CN2018/108066 dated Apr. 28, 2019.
Written Opinion of the International Searching Authority PCT/ISA/237 for International Application No. PCT/CN2018/108066 dated Apr. 28, 2019.

* cited by examiner

METHOD, SYSTEM, AND COMPUTER PROGRAM PRODUCT FOR IDENTIFYING DEVICE

PRIORITY STATEMENT

The present application is a continuation of and hereby claims priority under 35 U.S.C. § 120 to PCT application No. PCT/CN2018/108066 filed Sep. 27, 2018, the entire contents of which are hereby incorporated herein by reference.

FIELD

Embodiments of the application generally relate to the field of device supervision. Specifically, embodiments of the present application relate to a method, apparatus, system, storage medium, processor, and terminal for identifying a device.

BACKGROUND

A Supervisory Control and Data Acquisition (SCADA) system is a system that can supervise and control field devices and operations. SCADA systems are widely used in industries including electric power, fuel gas, chemical engineering, metallurgy, and railway. They can perform functions including data collection, device control, parameter adjustment, and measurement.

With the development of the Internet of Things (IoT) technology, more and more devices are connected to SCADA systems or other systems to provide information. It is difficult for an operator to select information he/she wants. Especially, artificial identification and manual selection of information in a field, for example, a workshop, a warehouse, a conduit, or a machine, takes a long time. Similar devices may puzzle operators, causing them to acquire incorrect information from the system.

Nowadays, with the development of augmented reality (AR) technology, image processing technology has become more and more sophisticated. Many mobile devices are capable of imaging processing for device identification. For example, QR codes, graphic marking cards, and other indicators are conventional means of simplifying the identification process and solving the problem of uniqueness.

With a method based on image processing, a characteristic point or characteristic shape of a target object is determined by image processing, and it is difficult to identify similar targets. In device identification, many devices in the same area are often of the same type. With a method based on image processing, it is difficult to identify a specific target device among a plurality of similar devices.

With a method based on QR code, a QR code is used to identify and track down a target that has an AR device, and information about the target is contained in the QR code associated with the target. The device, equipped with an image capturing unit and an image processing unit, can decode the QR code to acquire information about the target. In other words, much preparatory work, for example, generating a QR code and affixing it to each target, needs to be done before an identification operation.

In a method based on target indicator, target indicators are used to map a relationship between targets in a virtual environment and in the real world, and identifiers are used to identify the AR system and preset targets in the method. A camera records images of the real world by using identifiers and sets the positions of these identifiers to reference mapping points in a virtual world. Then, the targets are mapped between the virtual world and the real world. In this method, identifiers are essential for mapping, requiring completion of much preparatory work.

In a method based on graphic marking card, graphic marking cards are used to identify data collection points in a distributed control system. A marking card matches only one data collection point. Therefore, production of marking cards takes a long time.

SUMMARY

Embodiments of the present application provide a method, apparatus, system, storage medium, processor, and terminal for identifying a device to improve upon or even solve a problem with the prior art where devices of the same type in a field cannot be identified effectively.

In an aspect of an embodiment according to the present application, a method for identifying a device is provided, comprising: acquiring image data or video data that includes a device to be identified; acquiring, based on the image data or video data, characteristic information about the device to be identified; acquiring CAD model data about a plurality of device types; acquiring, based on the characteristic information and CAD model data, type information about a target type that identifies the device to be identified; acquiring a device layout document, the device layout document indicating a layout relationship among a plurality of devices that are of a plurality of device types; and acquiring, based on the target type and the layout relationship, target device information about the device to be identified.

In an aspect of an embodiment according to the present application, a method for identifying target device information about the device to be identified is provided, comprising:

acquiring image data or video data including a device to be identified;

acquiring, based on the image data or video data acquired, characteristic information about the device to be identified;

acquiring CAD model data about a plurality of device types;

acquiring, based on the characteristic information and the CAD model data acquired, type information about a target type identifying the device to be identified;

acquiring a device layout document, the device layout document indicating a layout relationship among a plurality of devices of a plurality of device types; and acquiring, based on the target type and the layout relationship, the target device information about the device to be identified.

In another aspect according to an embodiment of the present application, a system for identifying a device is further provided, comprising: a model database, containing CAD model data about a plurality of device types; a layout design document database, containing a device layout document, the device layout document expressing a layout relationship among a plurality of devices that are of a plurality of device types; and an apparatus for identifying a device, the apparatus comprising: an image acquisition unit, configured to acquire image data or video data that includes a device to be identified; a target identification unit, comprising: a characteristic extraction module, configured to acquire, based on the image data or video data, characteristic information about the device to be identified; a model acquisition module, configured to acquire CAD model data from a model database; a type identification module, configured to acquire, based on characteristic information and CAD model data, type information about a target type that identifies the device to be identified; a layout acquisition module, configured to acquire a device layout document from the layout design document database; and a device identification module, configured to acquire, based on a target type and layout relationship, target device information about the device to be identified.

In another aspect according to an embodiment of the present application, a system for identifying a device is further provided, comprising:

a model database, containing CAD model data about a plurality of device types;

a layout design document database, containing a device layout document, the device layout document expressing a layout relationship among a plurality of devices of the plurality of device types; and an apparatus to identify a device, the apparatus comprising an image acquisition unit, configured to acquire image data or video data that includes the device to be identified, a target identification unit, comprising:

a characteristic extraction module, configured to acquire, based on the image data or video data acquired, characteristic information about the device to be identified;

a model acquisition module, configured to acquire the CAD model data from the model database;

a type identification module, configured to acquire, based on the characteristic information and the CAD model data, type information about a target type that identifies the device to be identified;

a layout acquisition module, configured to acquire the device layout document from the layout design document database; and a device identification module, configured to acquire, based on the target type and the layout relationship, target device information about the device to be identified.

In another aspect of an embodiment according to the present application, a computer program product is further provided, physically stored in a non-transitory computer-readable medium and comprising a computer-executable instruction, wherein the computer-executable instruction, when executed, causes at least one processor to implement any one of the methods described above.

Thus, an embodiment according to the present application is implemented by a computer program to identify devices efficiently.

In another aspect of an embodiment according to the present application, a non-transitory computer-readable medium stores a computer-executable instruction, the computer-executable instruction, when executed, causing at least one processor to implement the method of at least one embodiment.

BRIEF DESCRIPTION OF THE DRAWINGS

The attached drawings are intended to provide a further understanding of the present application and constitute part of the present application. Example embodiments of the present application and explanations thereof are only illustrative of the present application, instead of limiting the present application. In the attached drawings.

DESCRIPTION OF REFERENCE NUMERALS

S102~S112: Steps;
S202~S214: Steps;
S302~S312: Steps;
S402~S408: Steps;
1. System for identifying a device
4. Apparatus for identifying a device;
41: Image acquisition unit;
43: Target identification unit;
431: Characteristic extraction module;
433: Model acquisition module;
435: Type identification module;
437: Layout acquisition module;
439: Device identification module;
6: Model database;
8: Layout design document database;
10: Supervisory control and data acquisition system;
12: Information display unit.

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/ hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

In an aspect of an embodiment according to the present application, a method for identifying a device is provided, comprising: acquiring image data or video data that includes a device to be identified; acquiring, based on the image data or video data, characteristic information about the device to be identified; acquiring CAD model data about a plurality of device types; acquiring, based on the characteristic information and CAD model data, type information about a target type that identifies the device to be identified; acquiring a device layout document, the device layout document indicating a layout relationship among a plurality of devices that are of a plurality of device types; and acquiring, based on the target type and the layout relationship, target device information about the device to be identified.

Thus, devices are identified effectively by pattern recognition in combination with CAD models and device layout documents.

According to an example embodiment of the present application, acquiring target device information about the device to be identified comprises: determining, based on a layout document, that a plurality of devices are of the target type; determining, based on the layout document, a number of device types associated with at least one relationship between devices of the target type and a related device; determining a first relationship that has the largest number of associated device types; acquiring image data or video data about the related device that is associated with the first relationship; acquiring, based on the image data or video data about the related device, characteristic information about the related device; acquiring, based on the characteristic information about the related device and the CAD model data, type information that identifies the related device; and comparing type information about the related device and the first relationship with the layout relationship expressed by the layout document to determine that the device to be identified is a target device expressed in the layout document that is associated with the related document by the first relationship.

Thus, when a plurality of devices that are of the same type exist in a field, a specific target device is determined by a relationship among the devices.

According to an example embodiment of the present application, acquiring image data or video data that includes a device to be identified comprises: detecting whether a plurality of devices exist in the image data or video data; if a plurality of devices exist, displaying an interactive interface for selecting one device from the plurality of devices as the device to be identified; receiving input for selecting one device from the plurality of devices; and determining, based on the input, that the selected device is the device to be identified.

Thus, when image data or video data includes a plurality of devices, the device to be identified is determined.

According to an example embodiment of the present application, the method further comprises: generating, based on identification information about the device to be identified, attribute information about the device to be identified; and displaying the attribute information.

Thus, information about the device to be identified is displayed to a user who needs it.

According to an example embodiment of the present application, characteristic information is a characteristic point or characteristic shape of the device to be identified that is extracted from image data or video data.

Thus, image data or video data is used in pattern recognition for comparison with data in a database.

In another aspect according to an embodiment of the present application, a system for identifying a device is further provided, comprising: a model database, containing CAD model data about a plurality of device types; a layout design document database, containing a device layout document, the device layout document expressing a layout relationship among a plurality of devices that are of a plurality of device types; and an apparatus for identifying a device, the apparatus comprising: an image acquisition unit, configured to acquire image data or video data that includes a device to be identified; a target identification unit, comprising: a characteristic extraction module, configured to acquire, based on the image data or video data, characteristic information about the device to be identified; a model acquisition module, configured to acquire CAD model data from a model database; a type identification module, configured to acquire, based on characteristic information and CAD model data, type information about a target type that identifies the device to be identified; a layout acquisition module, configured to acquire a device layout document from the layout design document database; and a device identification module, configured to acquire, based on a target type and layout relationship, target device information about the device to be identified.

Thus, devices are identified effectively by pattern recognition in combination with CAD models and device layout documents.

According to an example embodiment of the present application, the system further comprises: a supervisory control and data acquisition system, configured to acquire identification information from the target identification unit and, based on identification information about the device to be identified, generate attribute information about the device to be identified; and an information display unit, configured to display the attribute information.

Thus, information about the device to be identified is displayed to a user who needs it.

In another aspect of an embodiment according to the present application, a computer program product is further provided, physically stored in a non-transitory computer-readable medium and comprising a computer-executable instruction, wherein the computer-executable instruction, when executed, causes at least one processor to implement any one of the methods described above.

Thus, an embodiment according to the present application is implemented by a computer program to identify devices efficiently.

An embodiment according to the present application provides a technical solution of rapid device identification by using a CAD module, capable of identifying a device type to determine specific devices of that device type. If a plurality of similar devices exist and are difficult to identify, then layout information about the devices and images in a real environment recorded by a camera will be used to determine whether the device to be identified is unique, thereby at least solving the technical problem of difficulty in rapidly identifying devices, and thus the technical effects of efficient identification and device supervision are achieved.

In order for those of ordinary skill in the art to better understand the present application, the technical solution provided in embodiments of the present application will be described clearly and completely with reference to the drawings for embodiments of the present application. Obviously, the described embodiments are only some, but not all, embodiments of the present application. Any embodiments obtained by those of ordinary skill in the art based on the described embodiments of the present application without making inventive efforts fall into the protection scope of the present application.

Note that terms such as "first" and "second" used in the specification and claims of the present application and the above-mentioned drawings are intended to differentiate between similar targets, instead of describing a specific sequence or a precedence relationship. It should be understood that data used this way are interchangeable where appropriate, so that embodiments of the present application described herein may be implemented in a sequence other than any of those shown or described herein. Further, terms "comprising", "provided with", and any variants thereof are intended to cover nonexclusive inclusion. For example, a process, method, system, product, or device comprising a series of steps or modules or units are not necessarily limited to explicitly listed steps or modules or units, and instead may include other steps or modules or units that are not explicitly listed or are intrinsic to these processes, methods, systems, products, or devices.

Figure 1:
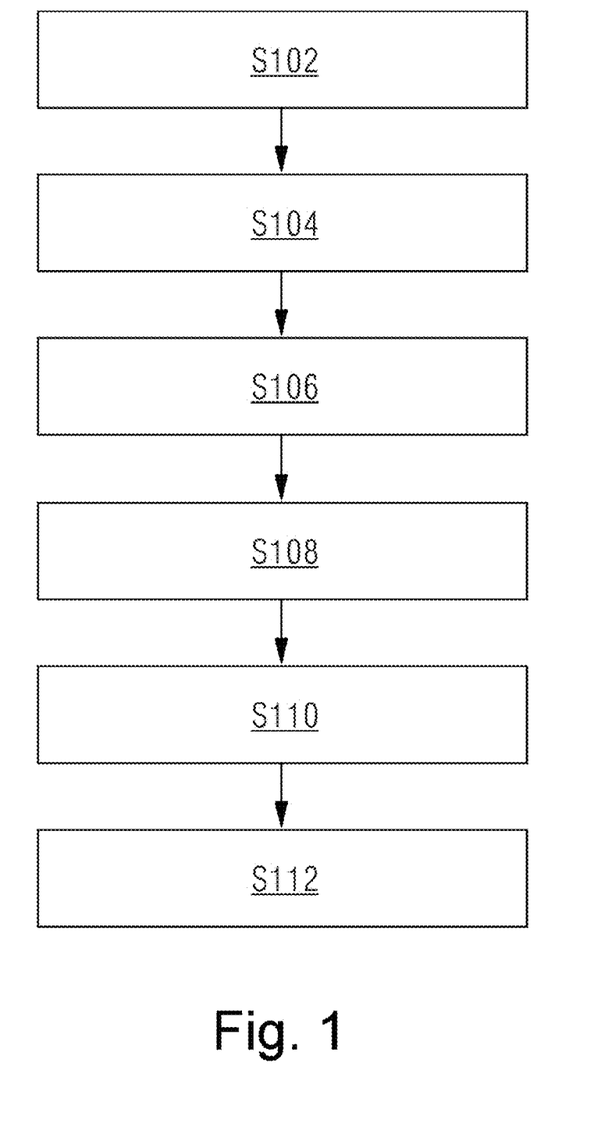
FIG. 1 is a flowchart of a method for identifying a device according to an embodiment of the present application.

Based on an embodiment of the present application, a method for identifying a device is provided. FIG. 1 is a flowchart of a method for identifying a device according to an embodiment of the present application. As shown in FIG. 1, a method for identifying a device according to an embodiment of the present application comprises the following steps. Step S102 is performed to acquire image data or video data that includes a device to be identified.

Specifically, a camera is used to photograph the device to be identified, thereby acquiring an image or video of the device to be identified. For example, a device to be identified may be photographed by a camera disposed in a mobile phone, a tablet PC, or any other mobile terminal. Then, step S104 is performed to acquire, based on the image data or video data, characteristic information about the device to be identified. An image and video contain the shape of the device, allowing acquisition of characteristic information about the structure of the device. In a field, a variety of types of devices are provided, for example, machine tools and electric machines. Since device shapes vary with device types, different types of devices have different characteristic information.

Then, step S106 is performed to acquire CAD model data about a plurality of device types. CAD model data contains modeling data about each type of device, indicating the structural characteristics of the device. Then, step S108 is performed to acquire, based on the characteristic information and CAD model data, type information about a target type that identifies the device to be identified; by a comparison between photographed characteristic information and CAD model data, it may be determined that matching data indicates that the device is of a particular type.

Further, step S110 is performed to acquire a device layout document, the device layout document indicating a layout relationship among a plurality of devices that are of a plurality of device types. A layout document comprises information about layout of each device, making known what device specifically a particular type of device is. It further comprises, for example, information about a device layout relationship, including what other devices are arranged around the device, a logical connection relationship among the devices, and a physical connection relationship among the devices. Specific devices are arranged in specific positions in a field and therefore have a specific layout relationship in a layout document.

Then, step S112 is performed to acquire, based on the target type and the layout relationship, target device information about the device to be identified. The device type determined by the CAD model is compared with the device type contained in the layout document, and matching data indicates that the data to be identified is a specific device in the layout document. Thus, devices are identified effectively by pattern recognition in combination with CAD models and device layout documents.

Figure 2:
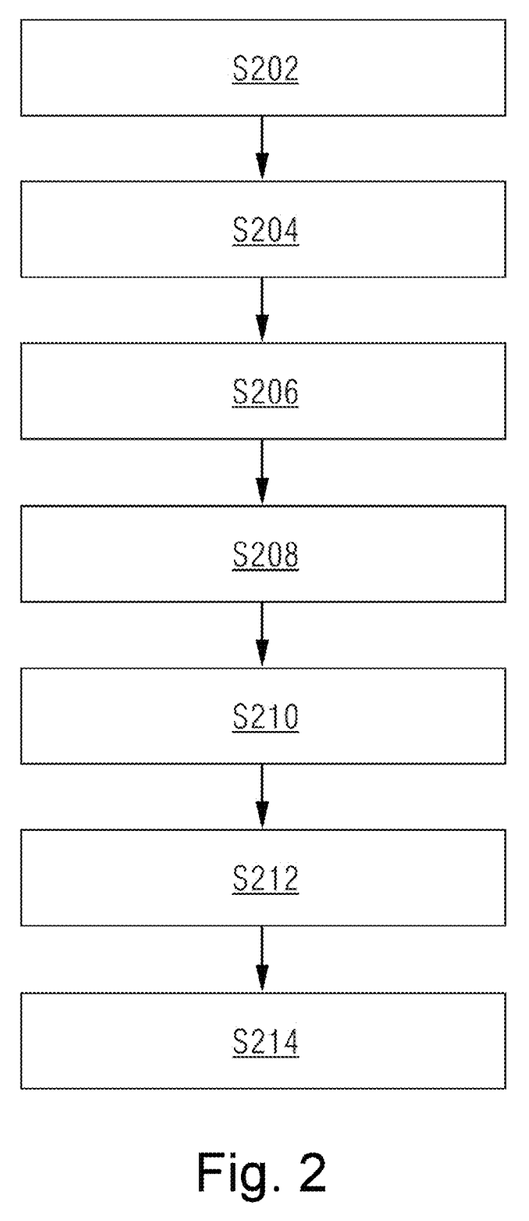
FIG. 2 is a flowchart of a method for acquiring target device information about a device to be identified according to an example embodiment of the present application.

FIG. 2 is a flowchart of a method for acquiring target device information about a device to be identified according to an example embodiment of the present application. As shown in FIG. 2, according to an example embodiment of the present application, acquiring target device information about the device to be identified comprises the following steps. Step S202 is performed to determine, based on a layout document, that a plurality of devices are of the target type. If the layout document shows that a plurality of devices exist that are of the same type, then a screening process of the device is executed to obtain a result of identifying a specific target device desired by the user.

Then, step S204 is performed to determine, based on the layout document, a number of device types associated with at least one relationship between devices of the target type and a related device. A relationship between a device and a related device, for example, is a spatial relationship, a logical connection relationship, or a physical connection relationship. For example, a device may be arranged to the left or right or on the upside of a related device, or transmit data to a related device, transfer an article to a related device, be located upstream or downstream of a process of a related device, or be connected to a related device by a data cable.

Then, step S206 is performed to determine a first relationship that has the largest number of associated device types. To take the following relationships as an example, the device has relationship 1 and relationship 2; if the device is associated with x related devices by relationship 1 and associated with y related devices by relationship 2, x being greater than y, then relationship 1 is a first relationship. The first relationship having the largest number is selected so that more mismatching options are eliminated in the screening process, thereby accelerating the screening.

Then, step S208 is performed to acquire image data or video data about the related device that is associated with the first relationship. A camera is used to photograph a related device, thereby acquiring an image or video of the device.

Then, step S210 is performed to acquire, based on the image data or video data about the related device, characteristic information about the related device. Step S212 is acquiring, based on the characteristic information about the related device and the CAD model data, type information that identifies the related device. Here, likewise, characteristic identification by image processing is compared with a CAD model to determine the device type of a related device.

Then, step S212 is performed to compare type information about the related device and the first relationship with the layout relationship expressed by the layout document to determine that the device to be identified is a target device expressed in the layout document that is associated with the related document by the first relationship. The above-described steps have determined the respective types of related devices associated with the device to be identified. In a layout document, a specific device performs a specific task, and a related device of a specific device is unique. Therefore, based on the type of a related device that has a specific relationship with the device to be identified, it is possible to determine which device specifically in the layout document the device to be identified is, thereby achieving device identification. Thus, when a plurality of devices that are of the same type exist in a field, a specific target device is determined by a relationship among the devices.

Figure 3:
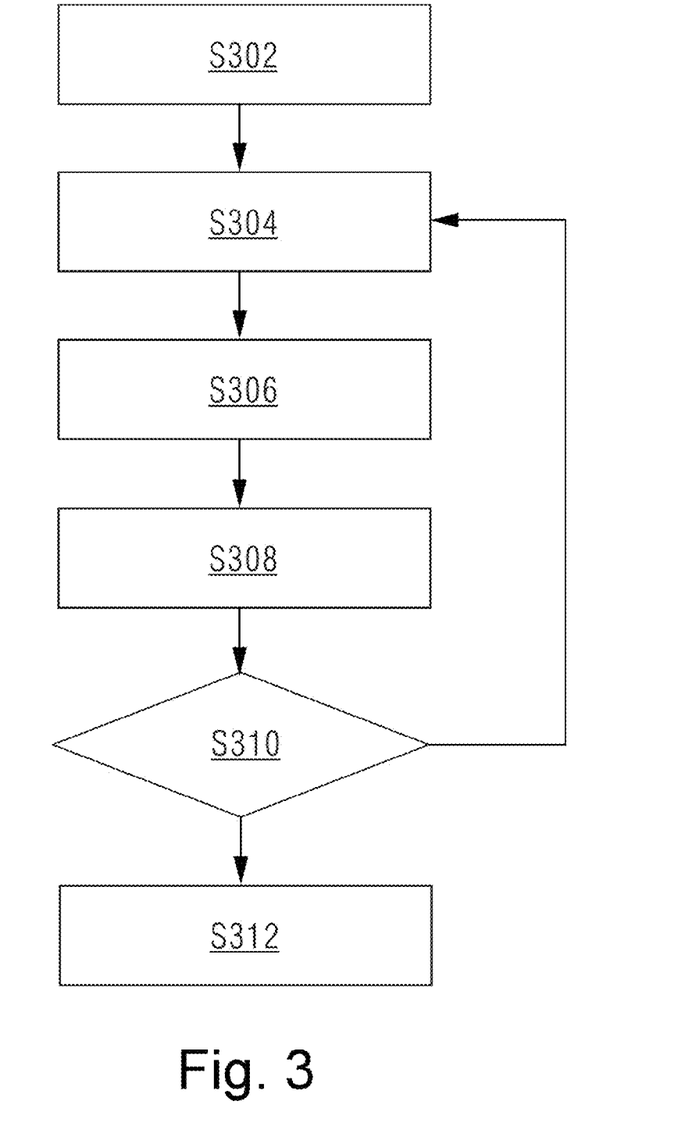
FIG. 3 is a flowchart of a method for acquiring target device information about a device to be identified according to another example embodiment of the present application.

A method for device screening in the present application may further be expressed in the following manner. FIG. 3 is a flowchart of a method for acquiring target device information about a device to be identified according to another example embodiment of the present application. FIG. 3 shows the screening flow starting from determination that a plurality of targets of the same type exist till acquisition of a screening result. If two or more targets are of the same type, then a display cell indicates existence of more similar targets in the area. Then, the process of target object screening is started. Assume that the number of similar targets is N, the object type is Ti (i=1, 2, . . . , n), there are n targets in the area, and the target object type is T1. The relationship among the targets is Rj (j=1, 2, . . . , m), and the target having a type of T1 has m relationships with other targets.

In step S302, the relationship Rx having the largest number of target types is determined.

The relationship Rx having the largest number of target types G(x) is found. The number of target types having the relationship Rx is G(x)=SUMPRODUCT (1/COUNTIF ((Rx, Ti),(Rx, Ti))). (Rx, Ti) is a set of relationships with a target object. SUMPRODUCT is a returned function of the sum of the products of corresponding arrays, and COUNTIF is a returned function of the number of elements that meet the conditions.

For example, there are four targets of T1 type, all the T1 targets have two relationships: R1 and R2, three targets, namely, T1, T2, and T3, are associated with T1 by relationship R1, and two targets, namely, T2 and T3, are associated with T1 by relationship R2. G1=3 and G2=2 can be established, and then Rx=R1 is established.

In step S304, an image or video of a related target having relationship Rx is recorded. For example, by a man-machine interface, a message is displayed instructing the user to make a recording again.

In step S306, the target type (device type) of a related target having relationship Rx is identified. The above-described method for identifying a device type is used for the identification.

In step S308, by relationship (Rj, Ti), the target list is screened and updated. In other words, if the target type of a related target recorded matches the target type of the related target in the layout document, then the target in the layout document is retained as a candidate; otherwise, the target is not retained.

In step S310, whether only one target exists in the list is judged. If the judgment result is yes, it indicates that the target in the list is the specific target object of the device to be identified, and the screening and identification processes are completed in step S312 to determine the identified target object. If the judgment result is no, then step S304 is performed again for iterative screening, thereby further finding the desired target object.

In addition, if two or more targets (devices) have the same relationship in the same area, then the target object screening process may be applied in an extended relationship, for example, a grandfather relationship. The relationships between related devices of the target object and related devices of the related devices are further compared, because each object has a unique layout relationship in an area.

In addition, if two or more devices were found to be of the same type before screening, the screening step may also be skipped and the obtained devices of the same type are displayed to the user, allowing the user to select a specific device.

In addition, a layout document may be a flow design document, which may be used to express a logical relationship, for example, an upstream relationship or a downstream relationship, in a flow. Such documents are all relationship documents generated during factory design. If the user wishes to use various relationship documents at the same time, it is possible to do so based on a technical solution of an embodiment of the present application.

Figure 4:
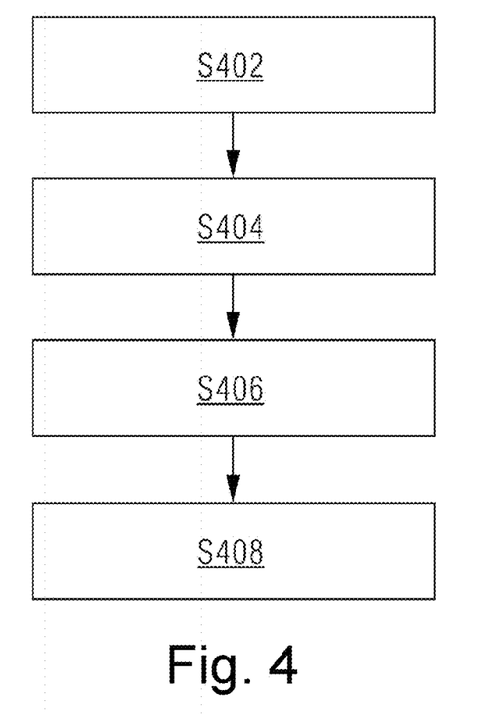
FIG. 4 is a flowchart of a method for acquiring image data or video data that includes a device to be identified according to an example embodiment of the present application.

FIG. 4 is a flowchart of a method for acquiring image data or video data that includes a device to be identified according to an example embodiment of the present application. As shown in FIG. 4, according to another example embodiment of the present application, acquiring image data or video data that includes a device to be identified comprises:

step S402, namely, detecting whether a plurality of devices exist in the image data or video data, and step S404, namely, if a plurality of devices exist, displaying an interactive interface for selecting one device from the plurality of devices as the device to be identified, step S406, namely, receiving input for selecting one device from the plurality of devices; and step S408, namely, determining, based on the input, that the selected device is the device to be identified. Thus, when image data or video data includes a plurality of devices, the device to be identified is determined.

According to an example embodiment of the present application, the method further comprises: generating, based on identification information about the device to be identified, attribute information about the device to be identified; and displaying the attribute information. For example, after acquisition of an identification result, information about the identification result is sent to a supervisory control and data acquisition system. The supervisory control and data acquisition system generates information needed by the user for identifying a device and sends the information to a display unit, which then displays the information to the user. Thus, information about the device to be identified is displayed to a user who needs it.

According to an example embodiment of the present application, characteristic information is a characteristic point or characteristic shape of the device to be identified that is extracted from image data or video data. Thus, image data or video data is used in pattern recognition for comparison with data in a database.

Figure 5:
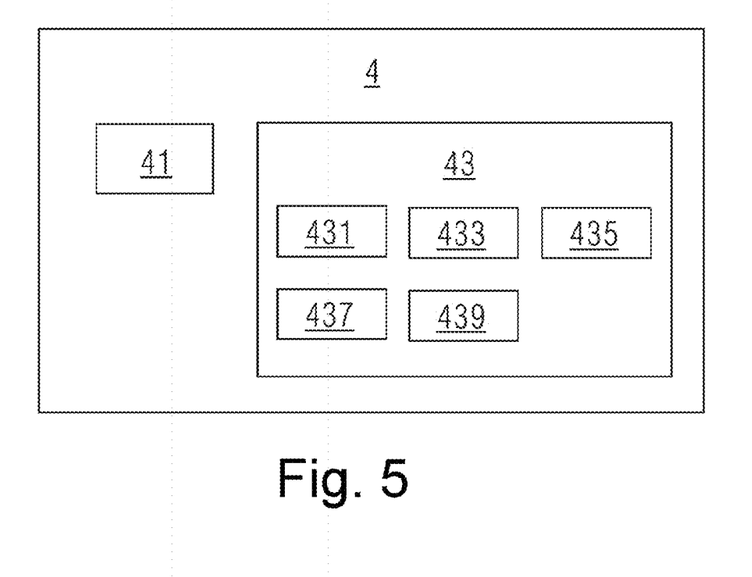
FIG. 5 is a block diagram for an apparatus for identifying a device according to an embodiment of the present application.

In another aspect according to an embodiment of the present application, an apparatus for identifying a device is further provided. FIG. 5 is a block diagram for an apparatus for identifying a device according to an embodiment of the present application.

As shown in FIG. 5, an apparatus 4 for identifying a device according to an embodiment of the present application comprises: an image acquisition unit 41, configured to acquire image data or video data that includes a device to be identified; a target identification unit 43, comprising: a characteristic extraction module 431, configured to acquire, based on the image data or video data, characteristic information about the device to be identified; a model acquisition module 433, configured to acquire CAD model data about a plurality of device types; a type identification module 435, configured to acquire, based on characteristic information and CAD model data, type information about a target type that identifies the device to be identified; a layout acquisition module 437, configured to acquire a device layout document, the device layout document indicating a layout relationship among a plurality of devices that are of a plurality of device types; and a device identification module 439, configured to acquire, based on a target type and layout relationship, target device information about the device to be identified. The above-described method is implemented to identify a device according to an embodiment of the present application, which will not be detailed again.

Figure 6:
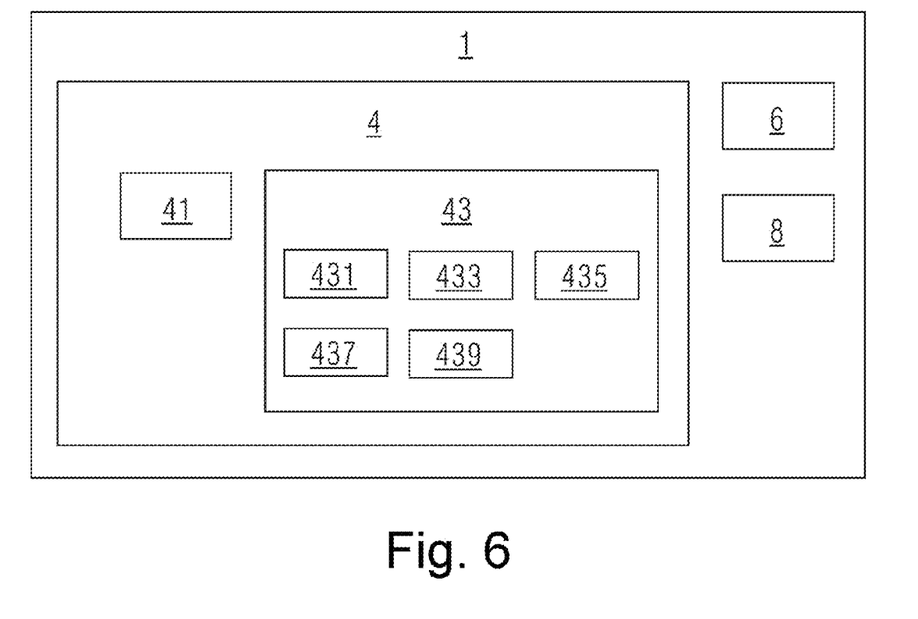
FIG. 6 is a block diagram for a system for identifying a device according to an embodiment of the present application.

In another aspect according to an embodiment of the present application, a system for identifying a device is further provided. FIG. 6 is a block diagram for a system for identifying a device according to an embodiment of the present application.

As shown in FIG. 6, a system 1 for identifying a device according to an embodiment of the present application comprises: a model database 6, containing CAD model data about a plurality of device types; a layout design document database 8, containing a device layout document, the device layout document expressing a layout relationship among a plurality of devices that are of a plurality of device types; and an apparatus 4 for identifying a device, the apparatus comprising: an image acquisition unit 41, configured to acquire image data or video data that includes a device to be identified; a target identification unit 43, comprising: a characteristic extraction module 431, configured to acquire, based on image data or video data, characteristic information about the device to be identified; a model acquisition module 433, configured to acquire CAD model data from a model database; a type identification module 435, configured to acquire, based on characteristic information and CAD model data, type information about a target type that identifies the device to be identified; a layout acquisition module 437, configured to acquire a device layout document from the layout design document database; and a device identification module 439, configured to acquire, based on a target type and layout relationship, target device information about the device to be identified.

Figure 7:
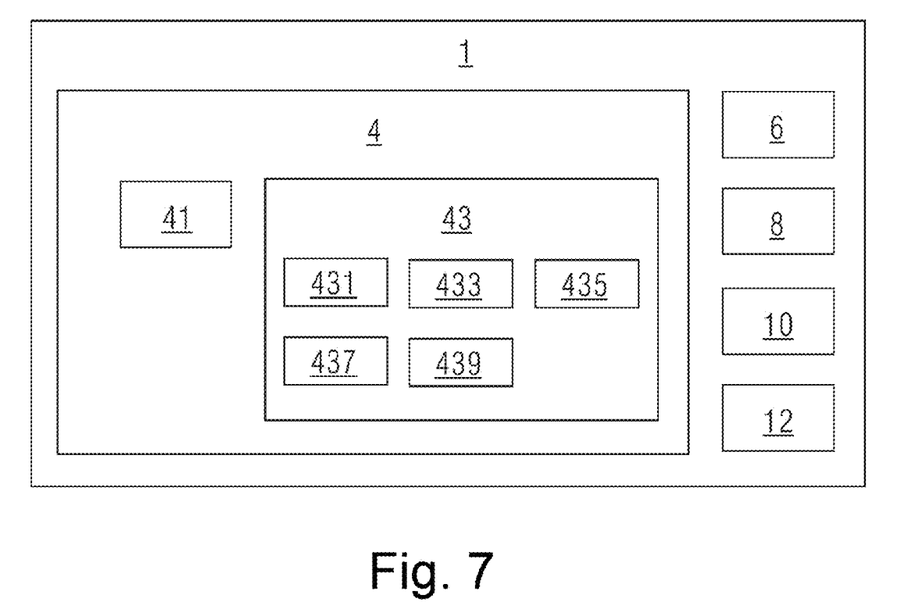
FIG. 7 is a block diagram for a system for identifying a device according to an example embodiment of the present application.

FIG. 7 is a block diagram for a system for identifying a device according to an example embodiment of the present application. The system 1 for identifying a device according to an example embodiment of the present application further comprises: a supervisory control and data acquisition system 10, configured to acquire identification information from the target identification unit and, based on identification information about the device to be identified, generate attribute information about the device to be identified; and an information display unit 12, configured to display the attribute information.

Further, the target identification unit 43 and the information display unit 12 may be disposed on the same device, for example, on the same mobile phone or tablet PC, or on different devices. For example, the target identification unit 43 may be disposed on a remote central computer, or on the supervisory control and data acquisition system 10, or on a standalone computer.

In the system 1 for identifying a device according to an embodiment of the present application, the image acquisition unit 41 is used to acquire an image or video of the target object (or device). Then, the image acquisition unit 41 sends the image or video data to the target identification unit 43, and the target identification unit 43 processes the acquired image or video, the image processing comprising characteristic extraction and other related processing. The target identification unit 43 identifies the type of the target object by the model database 6 (a CAD model database) and the characteristic point/characteristic shape of the recorded target object. The target identification unit 43 identifies a target object by the information in the layout design document database 8. Then, the target identification unit 43 sends basic information, including object name and object type, about the target object to the supervisory control and data acquisition system 10, requesting provision of information to the user. The supervisory control and data acquisition system 10, based on the request from the target identification unit 43, obtains object information and then sends the object information to the information display unit 12, displaying information about the target object to the user. Thus, devices are identified effectively by pattern recognition in combination with CAD models and device layout documents.

In another aspect of an embodiment according to the present application, a storage medium is further provided, and the storage medium comprises a stored program, wherein the program, when run, causes the device mounted with the storage medium to implement the above-described method.

In another aspect of an embodiment according to the present application, a processor is further provided, and the processor is used to run a program, wherein the program, when run, implements the above-described method.

In another aspect according to an embodiment of the present application, a terminal is further provided, comprising: one or more processors, a memory, and one or more programs, wherein the one or more programs are stored in the memory and are configured to be executed by the one or more processors, the one or more programs comprising use for implementing the above-described method.

In another aspect according to an embodiment of the present application, a computer program product is further provided, physically stored in a computer-readable medium and comprising a computer-executable instruction, wherein the computer-executable instruction, when executed, causes at least one processor to implement the above-described method.

Thus, an embodiment according to the present application is implemented by a computer program to identify devices efficiently.

With the technical solution of an embodiment according to the present application, objects/devices may be easily identified on the basis of a CAD model and a layout design document database of storage object/device relationships. Generally created during factory or workshop design, a layout design document database requires much less preparatory work than any other identification method, for example, QR code.

In each of the above-described embodiments of the present application, particular emphasis is put on an aspect, respectively; for a part not detailed in an embodiment, references may be made to relevant descriptions in other embodiments.

It should be understood that the technical contents disclosed in the embodiments provided by the present application may be implemented by other methods. The above-described apparatus embodiment is only illustrative. For example, the division of the units or modules is only logical function division, and an alternative division method may be employed in actual implementation. For example, a plurality of units or modules may be combined or integrated into another system, or certain characteristics may be ignored or not be executed. In addition, the shown or discussed mutual coupling or direct coupling or communication connection may be established via certain interfaces, and indirect coupling or communication connection between modules or units may be electrical or in any other form.

The units or modules described as separate components may or may not be physically separated. Components shown as units or modules may or may not be physical units or modules; in other words, they may be located in the same place or may be distributed on a plurality of network units or modules. An objective of the technical solution of an embodiment may be achieved by selecting some or all of the units or modules based on actual needs.

Further, the functional units or modules in each embodiment of the present application may be integrated in one processing unit or module, or each of the functional units or modules may exist physically and separately, or two or more units or modules may be integrated in one unit or module. The integrated unit or module may be implemented in the form of hardware or may be implemented in the form of a software functional unit or module.

To be implemented in the form of a software functional unit and sold or used as a standalone product, the integrated unit may be stored in a computer-readable storage medium. Based on such an understanding, the technical solution of the present application essentially, or for a part contributing to the prior art, or for all or part of the technical solution, may be embodied in the form of a software product. The computer software product is stored in a storage medium, comprising a plurality of instructions for causing a computer device (a personal computer, server, network device, etc.) to execute all or part of the steps of the method described in each embodiment of the present application. Examples of the above-mentioned storage medium include USB drive, Read-Only Memory (ROM), Random Access Memory (RAM), movable hard disk, magnetic disk, CD-ROM, or any other medium that can store program code.

While the present application has been particularly described above with reference to preferred embodiments, it should be understood that those of ordinary skill in the art can make various improvements and modifications without departing from the principle of the present application, and such improvements and modifications should also be considered to fall into the protection scope of the present application.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for identifying target device information about the device to be identified, comprising:
   acquiring image data or video data including a device to be identified;
   acquiring, based on the image data or video data acquired, characteristic information about the device to be identified;
   acquiring CAD model data about a plurality of device types;
   acquiring, based on the characteristic information and the CAD model data acquired, type information about a target type identifying the device to be identified;
   acquiring a device layout document, the device layout document indicating a layout relationship among a plurality of devices of a plurality of device types; and
   acquiring, based on the target type and the layout relationship, the target device information about the device to be identified.

2. The method of claim 1, wherein the acquiring of the target device information about the device to be identified comprises:
   determining, based on the layout document, that a plurality of devices are of the target type;
   determining, based on the layout document, a number of device types associated with at least one relationship between devices of the target type and a related device;
   determining a first relationship that has a relatively largest number of associated device types;

acquiring image data or video data about the related device associated with the first relationship;
acquiring, based on the image data or video data about the related device, characteristic information about the related device;
acquiring, based on the characteristic information about the related device and the CAD model data, type information that identifies the related device; and
comparing type information about the related device and the first relationship with the layout relationship expressed by the layout document to determine that the device to be identified is a target device expressed in the layout document associated with the related document by the first relationship.

3. The method of claim 1, wherein the acquiring of the image data or video data including a device to be identified comprises:
detecting whether a plurality of devices exist in the image data or video data;
displaying, upon detecting that the plurality of devices exist, an interactive interface for selecting one device from the plurality of devices as the device to be identified;
receiving input for selecting one device from the plurality of devices; and
determining, based on the input, that the selected device is the device to be identified.

4. The method of claim 1, further comprising:
generating, based on identification information about the device to be identified, attribute information about the device to be identified; and
displaying the attribute information.

5. The method of claim 1, wherein the characteristic information is a characteristic point or characteristic shape of the device to be identified extracted from the image data or video data.

6. A non-transitory computer-readable medium storing a computer-executable instruction, the computer-executable instruction, when executed, causing at least one processor to implement the method of claim 1.

7. The method of claim 2, further comprising:
generating, based on identification information about the device to be identified, attribute information about the device to be identified; and
displaying the attribute information.

8. The method of claim 2, wherein the characteristic information is a characteristic point or characteristic shape of the device to be identified extracted from the image data or video data.

9. The method of claim 3, further comprising:
generating, based on identification information about the device to be identified, attribute information about the device to be identified; and
displaying the attribute information.

10. The method of claim 3, wherein the characteristic information is a characteristic point or characteristic shape of the device to be identified extracted from the image data or video data.

11. A system for identifying a device, comprising:
a model database, containing CAD model data about a plurality of device types;
a layout design document database, containing a device layout document, the device layout document expressing a layout relationship among a plurality of devices of the plurality of device types; and
an apparatus to identify a device, the apparatus comprising
an image acquisition unit, configured to acquire image data or video data that includes the device to be identified,
a target identification unit, comprising:
a characteristic extraction module, configured to acquire, based on the image data or video data acquired, characteristic information about the device to be identified;
a model acquisition module, configured to acquire the CAD model data from the model database;
a type identification module, configured to acquire, based on the characteristic information and the CAD model data, type information about a target type that identifies the device to be identified;
a layout acquisition module, configured to acquire the device layout document from the layout design document database; and
a device identification module, configured to acquire, based on the target type and the layout relationship, target device information about the device to be identified.

12. The system of claim 11, further comprising:
a supervisory control and data acquisition system, configured to acquire identification information from the target identification unit and, based on the identification information about the device to be identified, generate attribute information about the device to be identified; and
an information display unit, configured to display the attribute information.

* * * * *